US012503938B2

(12) United States Patent
Uvarov et al.

(10) Patent No.: US 12,503,938 B2
(45) Date of Patent: Dec. 23, 2025

(54) DRILLING OPTIMIZATION METHOD

(71) Applicant: RNA Capital, Inc., Houston, TX (US)

(72) Inventors: Igor Uvarov, Houston, TX (US); Igor Kuvaev, Houston, TX (US)

(73) Assignee: RNA Capital, Inc., Houston, TX (US)

( * ) Notice: Subject to any disclaimer, the term of this patent is extended or adjusted under 35 U.S.C. 154(b) by 0 days.

(21) Appl. No.: 18/906,138

(22) Filed: Oct. 3, 2024

(65) Prior Publication Data

US 2025/0277436 A1 Sep. 4, 2025

Related U.S. Application Data

(60) Provisional application No. 63/561,217, filed on Mar. 4, 2024.

(51) Int. Cl.

*E21B 44/00* (2006.01)
*E21B 7/04* (2006.01)
*E21B 47/026* (2006.01)
*G06F 30/20* (2020.01)

(52) U.S. Cl.

CPC ................ *E21B 44/00* (2013.01); *E21B 7/04* (2013.01); *E21B 47/026* (2013.01); *G06F 30/20* (2020.01); *E21B 2200/20* (2020.05)

(58) Field of Classification Search

CPC ........................... E21B 47/026; E21B 2200/20
See application file for complete search history.

(56) References Cited

U.S. PATENT DOCUMENTS

| | | | | |
|---|---|---|---|---|
| 8,442,769 | B2 * | 5/2013 | Phillips | E21B 47/04 73/152.01 |
| 8,793,111 | B2 | 7/2014 | Tilke et al. | |
| 8,875,806 | B2 | 11/2014 | Williams | |
| 9,378,419 | B2 | 6/2016 | Simske et al. | |
| 10,168,447 | B2 | 1/2019 | Priezzhev et al. | |
| 10,353,356 | B2 | 7/2019 | Woodward et al. | |
| 10,422,924 | B2 * | 9/2019 | Zhang | G01V 1/40 |
| 10,677,052 | B2 | 6/2020 | Storm, Jr. et al. | |
| 10,871,589 | B2 | 12/2020 | Barrou et al. | |
| 11,162,349 | B2 * | 11/2021 | Flanagan | E21B 7/04 |
| 11,401,798 | B2 | 8/2022 | Panchal et al. | |
| 11,480,045 | B2 * | 10/2022 | Denisenko | E21B 7/046 |
| 11,940,589 | B2 * | 3/2024 | Butt | G01V 1/40 |
| 2008/0239871 | A1 | 10/2008 | Thevoux-Chabuel | |
| 2010/0312478 | A1 | 12/2010 | Tabanou et al. | |
| 2012/0191354 | A1 | 7/2012 | Caycedo | |

(Continued)

FOREIGN PATENT DOCUMENTS

| | | | |
|---|---|---|---|
| CA | 2888037 | A1 | 5/2014 |
| EP | 2420863 | A2 | 2/2012 |
| WO | 2015130836 | A1 | 9/2015 |

*Primary Examiner* — Tara Schimpf
*Assistant Examiner* — Ursula Lee Norris
(74) *Attorney, Agent, or Firm* — Saunders McKeon PLLC; Christopher McKeon

(57) ABSTRACT

A method for optimizing a wellbore model that measures a plurality of topsets and horizons in one or more offset well that correspond to a plurality of drilling parameters by depth, using those measured topsets and horizons to plan a well by rescaling depths of the drilling parameters if the inclination of the well corresponds to a vertical inclination or scaling the drilling parameters to their true vertical thickness if the inclination of the well corresponds to a horizontal inclination.

17 Claims, 10 Drawing Sheets

(56) References Cited

U.S. PATENT DOCUMENTS

| | | | | |
|---|---|---|---|---|
| 2013/0131989 | A1 | 5/2013 | Buiting et al. | |
| 2013/0222390 | A1 | 8/2013 | Ross et al. | |
| 2013/0238306 | A1 | 9/2013 | Lagenwalter et al. | |
| 2014/0025302 | A1 | 1/2014 | Alshawaf et al. | |
| 2015/0000980 | A1* | 1/2015 | Williams | E21B 49/003<br>175/45 |
| 2015/0292266 | A1 | 10/2015 | Johnson et al. | |
| 2016/0076357 | A1 | 3/2016 | Hbaieb | |
| 2016/0341834 | A1 | 11/2016 | Bartetzko et al. | |
| 2018/0230781 | A1* | 8/2018 | Garcia | E21B 41/00 |
| 2019/0106974 | A1 | 4/2019 | Kuvaev et al. | |
| 2020/0248545 | A1* | 8/2020 | Maus | E21B 44/00 |
| 2020/0300064 | A1* | 9/2020 | Gee | E21B 43/305 |
| 2020/0378248 | A1* | 12/2020 | Maus | E21B 44/06 |
| 2022/0127951 | A1* | 4/2022 | Sun | E21B 7/04 |

* cited by examiner

DRILLING OPTIMIZATION METHOD

RELATED APPLICATIONS

This application claims priority to U.S. Provisional Application No. 63/561,217, filed Mar. 4, 2024.

BACKGROUND

The disclosure relates to analyzing drilling parameters over geological intervals in the field of drilling wells. Oil and gas bearing rocks are often present in layered formations. In the past, mostly vertical wells were drilled to produce hydrocarbons from these formations. However, the industry switched to horizontal well drilling as horizontal wells that go along the productive formation can result in better production performance.

SUMMARY OF THE EXAMPLE EMBODIMENTS

An embodiment may relate to a method for optimizing a wellbore model comprising measuring a plurality of geologic topsets and formation horizons in at least one offset well that correspond to a plurality of drilling parameters by depth, combining the measured plurality of topsets and horizons to form a planned well, determining the inclination of the planned well, rescaling depths of the drilling parameters if the inclination is less than the predetermined inclination, and scaling the drilling parameters to their true vertical thickness if the inclination is greater than the predetermined inclination.

An example embodiment may include method for optimizing a wellbore model comprising measuring a plurality of geological topsets and formation horizons from at least one offset well, wherein the topsets correspond to a plurality of drilling parameters, including weight on bit (WOB), rotary speed (RPM), mud flow rate, and differential pressure, by depth, combining the measured plurality of topsets and horizons to form a planned well trajectory, determining the inclination of the planned well and whether it is greater than or less than a predetermined threshold, rescaling depths of the drilling parameters if the inclination is less than the predetermined inclination, scaling the drilling parameters to their true vertical thickness if the inclination is greater than the predetermined inclination, monitoring real-time drilling data from downhole sensors and dynamically adjusting the rescaled drilling parameters in response to changes in formation dip and inclination to optimize the rate of penetration (ROP) and controlling the drilling equipment in real time using the rescaled drilling parameters and adjusting the drilling operations based on real-time sensor data from downhole sensors.

A variation of the example embodiment may include the at least one offset well being a plurality of offset wells. Each topset may denote a change in formation. Calculating the TVT index of drilling parameters in at least one desired geological formation may include compressing or unclenching the vertical thickness of the geologic formation to scale the data to the true vertical thickness of the same geologic formation in the planned well. The predetermined inclination may be 85 degrees. Rescaling of the topset of the drilling parameters may include rescaling the hole depth equivalent in the planned well topset to generate a drilling parameter calculation to generate a roadmap for the planned well. The scaling of the drilling parameters to their true vertical thickness may include calculating the true vertical thickness index of a plurality of desired geological formations to generate a statistical analysis of the drilling parameters and rate of penetration and to further generate a heatmap for the planned well. It may include planning a drilling program. It may include adjusting the drilling program during real-time drilling.

An example embodiment may include a method for optimizing a wellbore model, comprising measuring a plurality of geological topsets and formation horizons from at least one offset well, wherein the topsets correspond to a plurality of drilling parameters, including weight on bit (WOB), rotary speed (RPM), mud flow rate, and differential pressure, by depth, combining the measured plurality of topsets and horizons to form a planned well trajectory, determining the inclination of the planned well trajectory, wherein the predetermined inclination threshold is between 80 and 85 degrees, rescaling the depth of the drilling parameters using a Hole Depth Equivalent (HDE) method if the inclination is less than the predetermined threshold, the rescaling proportionally adjusting the drilling parameters based on geological formation thicknesses, scaling the drilling parameters to their true vertical thickness (TVT) if the inclination exceeds the predetermined threshold, wherein TVT scaling compresses or expands the drilling parameters based on the true vertical thickness of the geological formation encountered in the planned well, and further comprising monitoring real-time drilling data from downhole sensors and dynamically adjusting the rescaled drilling parameters in response to changes in formation dip and inclination to optimize the rate of penetration (ROP).

An example embodiment may include a method for optimizing a wellbore model, comprising measuring a plurality of geological topsets and formation horizons from at least one offset well, wherein the topsets correspond to a plurality of drilling parameters, including weight on bit (WOB), rotary speed (RPM), mud flow rate, and differential pressure, by depth, combining the measured plurality of topsets and horizons to form a planned well trajectory, determining the inclination of the planned well trajectory, wherein the predetermined inclination threshold is between 80 and 85 degrees, rescaling the depth of the drilling parameters using a Hole Depth Equivalent (HDE) method if the inclination is less than the predetermined threshold, the rescaling proportionally adjusting the drilling parameters based on geological formation thicknesses, scaling the drilling parameters to their true vertical thickness (TVT) if the inclination exceeds the predetermined threshold, wherein TVT scaling compresses or expands the drilling parameters based on the true vertical thickness of the geological formation encountered in the planned well, monitoring real-time drilling data from downhole sensors and dynamically adjusting the rescaled drilling parameters in response to changes in formation dip and inclination to optimize the rate of penetration (ROP) and controlling the drilling equipment in real time using the rescaled drilling parameters and adjusting the drilling operations based on real-time sensor data from downhole sensors.

A variation of the example embodiment may include the at least one offset well being a plurality of offset wells, and the drilling parameters of each offset well are scaled using a hole depth equivalent (HDE) method for vertical or deviated well sections, and a true vertical thickness (TVT) method for horizontal well sections. It may include generating a roadmap for the planned well based on the rescaled drilling parameters from the plurality of offset wells; and calculating the optimal rate of penetration (ROP) for the planned well by analyzing the rescaled data from the offset wells. It may include measuring rate of penetration (ROP) by depth. It may include monitoring real-time drilling data from the planned well during drilling operations and adjusting the drilling parameters based on the monitored real-time data using the rescaled and true vertical thickness-scaled parameters from the offset wells. The real-time data may be transmitted via a Wellsite Information Transfer Standard Markup Language (WITSML) interface for analysis by third-party software systems. It may include performing statistical analysis of the rescaled drilling parameters to identify optimal drilling performance across geological formations and generating a heatmap of expected drilling efficiency for the planned well. It may include using Mechanical Specific Energy (MSE) analysis to optimize the roadmap by identifying drilling inefficiencies and adjusting the weight on bit (WOB) and rotary speed (RPM) to enhance drilling performance. The scaling of the drilling parameters may be based on the geological formation characteristics, including formation dips, thicknesses, and horizons, and the parameters are adjusted for different geological conditions within the well trajectory. It may include planning a drilling program for the planned well, wherein the drilling parameters of the planned well are optimized based on the rescaled and TVT-scaled data from the offset wells. It may include adjusting the drilling program during real-time drilling operations based on the real-time data and the optimized roadmap created from the offset well data. It may include integrating third-party geological modeling software to correlate the offset well data with the geological topsets and horizons, and rescaling the data using the true vertical thickness index for the planned well trajectory.

BRIEF DESCRIPTION OF THE DRAWINGS

For a thorough understanding of the disclosed embodiments, reference is made to the following detailed description of the preferred embodiments, taken in conjunction with the accompanying drawings in which reference numbers designate like or similar elements throughout the several figures of the drawing. Briefly.

DETAILED DESCRIPTION OF THE EXAMPLE EMBODIMENTS

Figure 1:
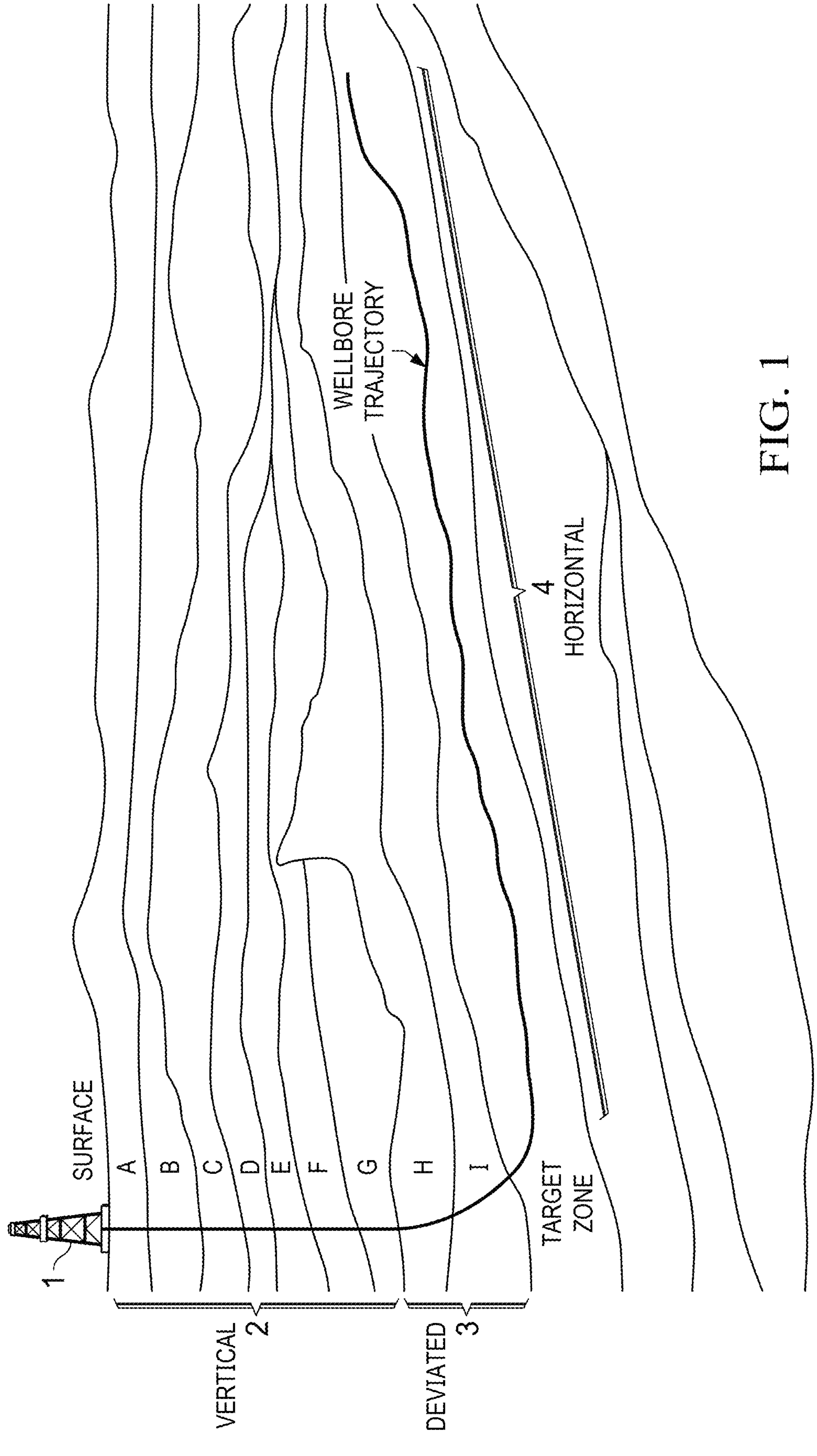
FIG. 1 shows an example embodiment of a generalized wellbore along drilled formations.

In the following description, certain terms have been used for brevity, clarity, and examples. No unnecessary limitations are to be implied therefrom and such terms are used for descriptive purposes only and are intended to be broadly construed. The different apparatus, systems and method steps described herein may be used alone or in combination with other apparatus, systems and method steps. It is to be expected that various equivalents, alternatives, and modifications are possible within the scope of the appended claims.

Several terms used in this disclosure are defined, without limitation of the disclosed embodiments, as follows:

Offset wells—already drilled nearby wells or wells from a current oilfield selected to be a reference for a planned one, with known and recorded actual drilling parameters such as weight on bit (WOB), rotary speed RPM (revolution per minute), Mud Flow In rate and others as well as the actual measured ROP.

TVT scale—True Vertical Thickness scale. Projecting measured by horizontal depth data in this scale allows us to compare it one-to-one with our active drilling well in the same scale and eliminates artifacts in response caused by varying wellbore Inclination and Azimuth.

Geological Topset—Information about measured depths of the geological tops changes across the well path. A topset refers to the depth markers or data points that represent the top boundaries of different geological formations or layers encountered during the drilling process. These topsets indicate the depth at which significant changes in geological formations occur, such as the transition between rock types or strata. Topsets represent geological depth markers that are measured in offset wells and then used to correlate and optimize drilling parameters in a planned well. By knowing the topsets, the depth and behavior of the geological formations in a planned well can be predicted and drilling parameters adjusted accordingly.

Drilling regime—The combination of drilling parameters which are surface controllable to achieve optimum ROP. Example drilling parameters are WOB, Differential Pressure, RPM, and Mud Flow In rate.

ROP—Rate of penetration, ft/hour

RPM—Revolution per minute

WOB—Weight on bit, lbf

Mud Flow in rate—Gallons per minute, liters per minute.

Differential Pressure—The difference in hydraulic pressure between the input and output of the mud motor, usually corresponding to motor output torque, expressed in psi.

Drilling mode is categorized into three distinct modes based on surface readings of drilling parameters. Rotary Drilling: In this mode, the entire drill string rotates while drilling and maximum ROP is achieved. Slide Drilling: This mode is characterized by the objective of following a directional path rather than drilling at maximum speed. Oscillate Drilling: This is also a directional drilling mode, but with surface RPM readings exhibiting a sinusoidal pattern.

Topset—depth markers, the set of tops for the specific geological intervals.

An example embodiment may include applications in both the well planning stage and/or during real-time drilling. An example embodiment may include the optimization method, performed in rotary drilling (non-sliding) mode, can be categorized into two approaches based on the shape of the well trajectory. Each approach is distinguished by a unique algorithm for scaling the drilling parameters, within the same geological formation, across the offset wells to the current well.

For the vertical and slanted parts of the well, the geological rescaling coefficients approach may be used.

For the horizontal section (the case when the inclination of well trajectory is more than 85 degrees), the TVT scaling of drilling parameters may be used.

FIG. 1 shows the basic example embodiment of a horizontal well drilled to maximize the output from the target zone. The well drilled using a drilling rig 1 has a wellbore trajectory starting at the surface remaining vertical 2 (formations A-G) to a certain geologic formation, in this example to formation G. On reaching the Top of formation H (Topset H), the wellbore deviated 3 with increased inclination through formation H and I and finally landed in the Target Zone with inclination more than 85 degrees. Then the well is drilled horizontally 4 along the Target Zone maintaining the trajectory within the interpreted formation top and bottom.

Figure 2:
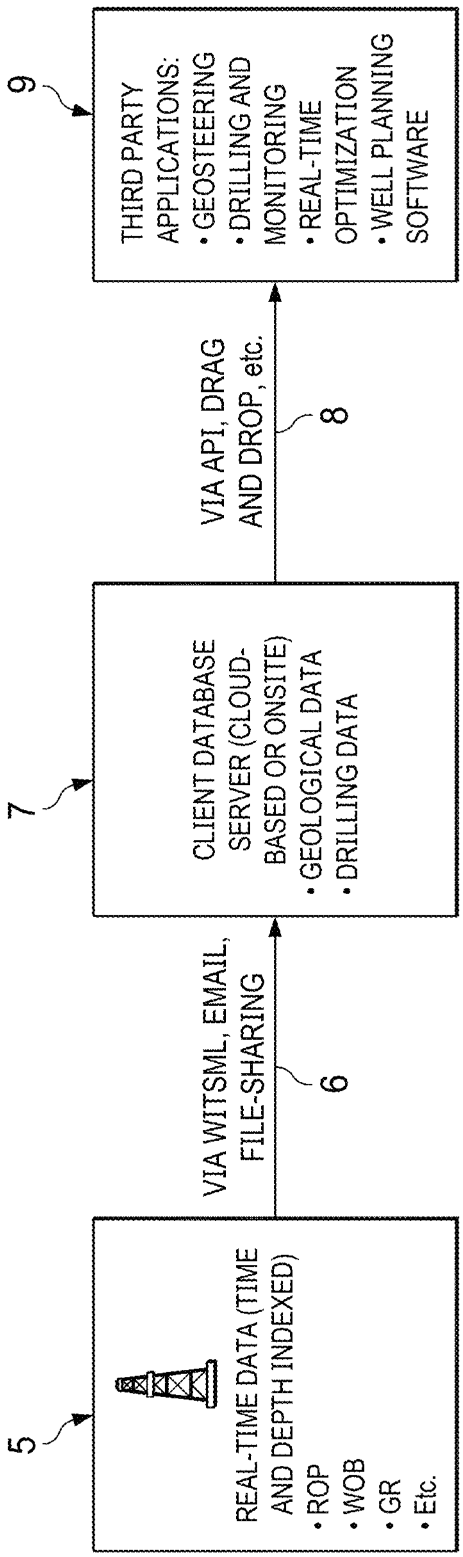
FIG. 2 shows an example embodiment of transmission and accessibility of the drilling data.

FIG. 2 shows an example embodiment of the general flow of data from rig site 5 to the client accessible servers via WITSML (Wellsite Information Transfer Standard Markup Language), Email or File Sharing 6. The WITSML, which stands for Wellsite Information Transfer Standard Markup Language, is primarily used in the oil and gas industry to facilitate the exchange of drilling, completion, and wellbore data. It is an industry standard for transmitting technical data between oilfield systems.

Data transmitted from the rig site is saved on local on-site or cloud-based servers 7 on the client side to be disseminated to and analyzed by respective groups involved in the exploration and production side of an oil and gas company. This data can be accessed via API or drag and drop 8 for third party software 9 to use it for multiple workflows, analysis and interpretation. An API (Application Programming Interface) for connecting to data is a set of rules and protocols that allows one software application to communicate with another, typically to retrieve, manipulate, or store data. In the context of WITSML (Wellsite Information Transfer Standard Markup Language), a WITSML API enables applications to interact with WITSML servers to access and manage wellsite data.

Figure 3A:
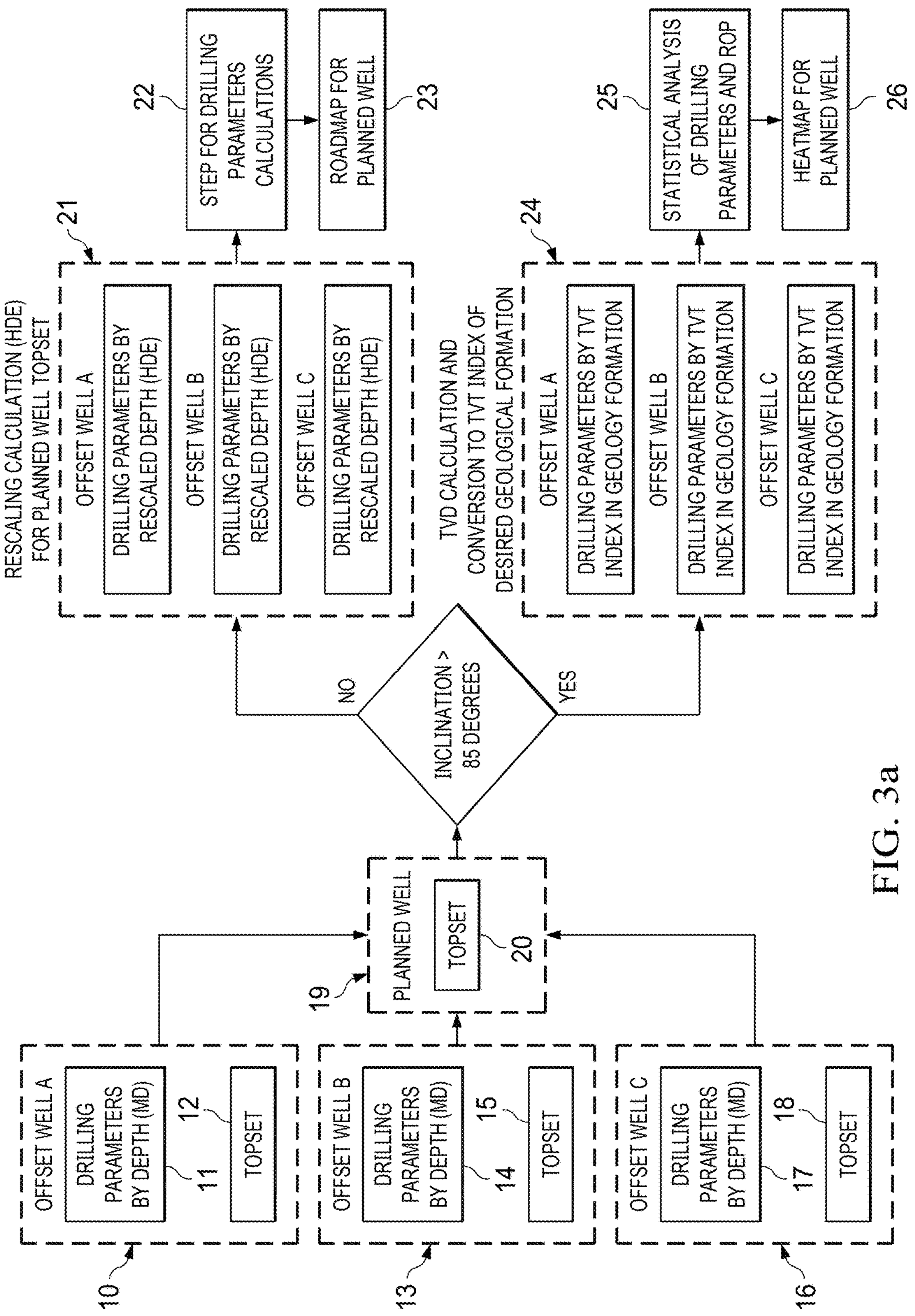
FIG. 3*a* shows an example embodiment of workflow of Drilling Optimization method.

FIG. 3*a* shows an example workflow of a drilling optimization method. A first offset well A 10 has drilling parameters by depth 11 and topset 12. A second offset well B 13 has drilling parameters by depth 14 and topset 15. A third offset well C 16 has drilling parameters by depth 17 and topset 18. A planned well 19 uses the combined topsets 20. The offset well data of the drilling parameters from the three wells A, B and C are rescaled and correlated to the planned well by the geologic intervals drilled.

A conditional requirement of inclination less than or greater than 85 degrees is needed to distinguish between the vertical plus deviated section of the wellbore from the horizontal/lateral section of the wellbore. If the inclination is less than 85 degrees, the rescaling and correlation of the drilled parameters, in measured depth (MD), from offset wells to the planned well topset 21 is done using the Hole Depth Equivalent (HDE) method, which is described in detail below. An end-user defined step 22, subjective to experience and preference, is determined which then is used for further drilling parameters calculations and used to develop the roadmap 23 for the planned well.

If the inclination is greater than 85 degrees, the drilling parameters in depth series are converted from MD to TVD to TVT domain for each offset well A to C and scaled to a TVT index of desired geological formation 24. Rescaling offsets to active well is done with method similar to HDE, but by taking interpreted formation horizons TVT instead of tops in MD, and TVT depth indexes for offset well data instead of MD. A statistical analysis of the drilling parameters and ROP 25 is then provided, which generates heatmap 26 for the planned well.

Figure 3B:
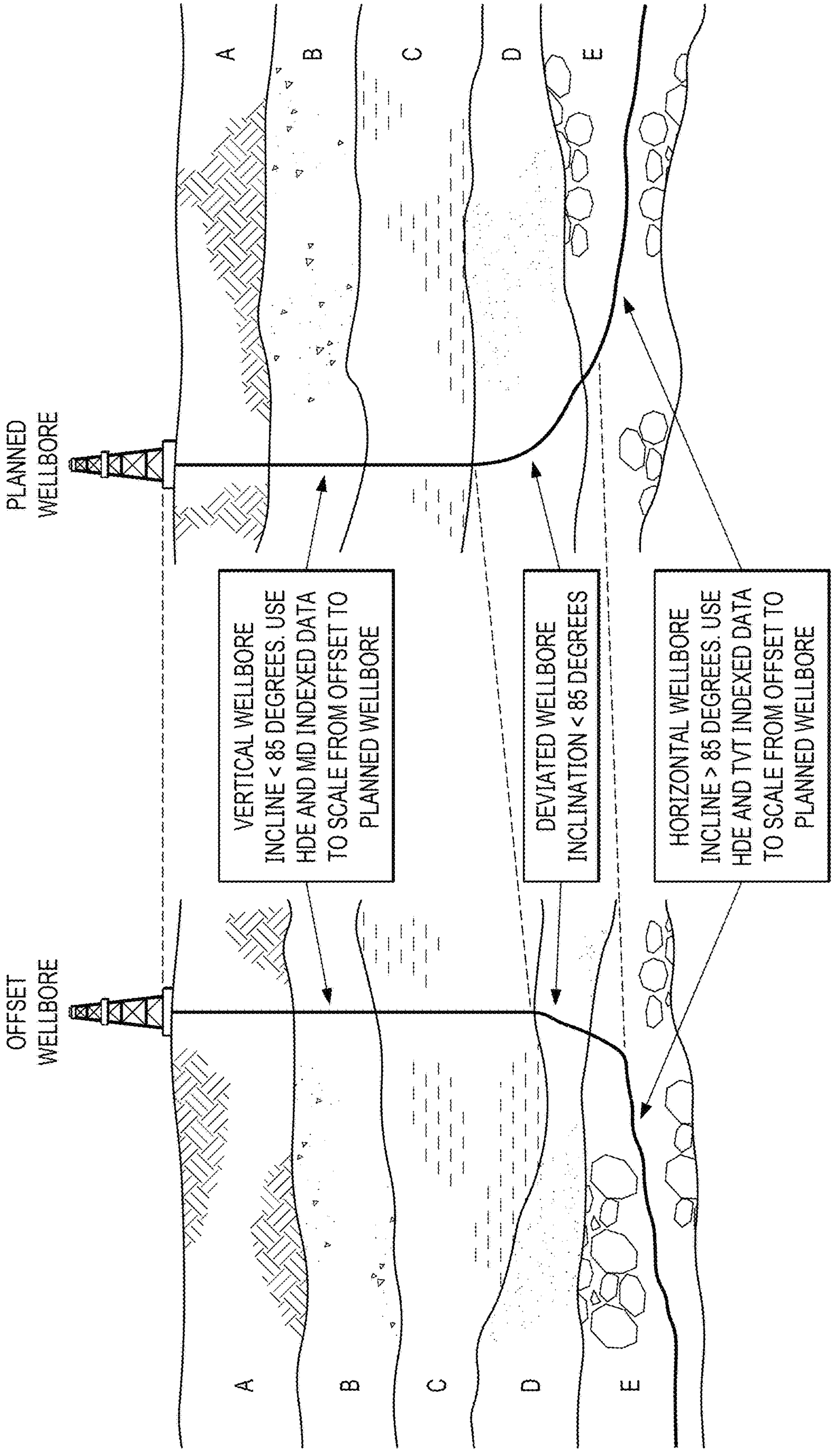
FIG. 3*b* shows an example embodiment of rescaling from one offset to planned well.

FIG. 3*b* shows the example of a generalized offset and active wellbore along with the encountered formations in varying thicknesses. For geological rescaling coefficients, the input parameters include drilling parameters at the offset well location in depth domain (depth-based logs). An example, as shown in following Table 1, shows the following depth logs at offset wellbore in usual one feet interval.

| MD, ft | ROP, ft/hr | WOB, klbf | RPM, 1/min |
|---|---|---|---|
| 4,100 | 0 | 0 | 0 |
| 4,101 | 23 | 2.3 | 24 |
| 4.102 | 32 | 4.4 | 25 |

Example topset depth markers are shown in the following Table 2:

| Top name | MD, ft (at offset wellbore) | MD, ft (at planned wellbore) |
|---|---|---|
| Top A | 4,090 | 4,100 |
| Top B | 4,610 | 4,601 |
| Top C | 5,540 | 5,495 |
| Top D | 7,123 | 7,179 |
| Top E | 7,400 | 7,461 |

For every offset well in the analysis, the drilling parameters curves are scaled to fit the thickness of geological formations of planned well. The boundaries of each geological formation are defined based on the provided Tops in MD (see Table 2). The resultant scaled data from offset well to planned well can be represented in the Hole Depth Equivalent (HDE) scale. The main assumption is that the same drilling parameters observed in the offset well will be seen along the trajectory of the planned well within the same penetrated geological formations.

In FIG. 3*b*, for the vertical and deviated wellbore with inclination less than 85 degrees, the MD indexed offset data is scaled to the planned wellbore using HDE.

Here is how the HDE is defined:

For offset MD=0,planned HDE=0.

For each subsequent sample (i+1), HDE (i+1) is calculated as follows:

$$HDE(i+1) = HDE(i) + (MD(i+1) - MD(i)) * \big[(\text{Lower Top} - \text{Upper Top}) \text{ of the planned well}/(\text{Lower Top} - \text{Upper Top})\big] \text{ of the offset well}\big] \text{ for every geologic formation.}$$

This process is repeated for each pair of offset well and active well, resulting in the calculation of HDE scaled curves of drilling parameters. As a result, the drilling parameters for each offset well, originally defined by Measured Depth, now have an equivalent index of measured depth corresponding to the position of the planned well.

Figure 4:
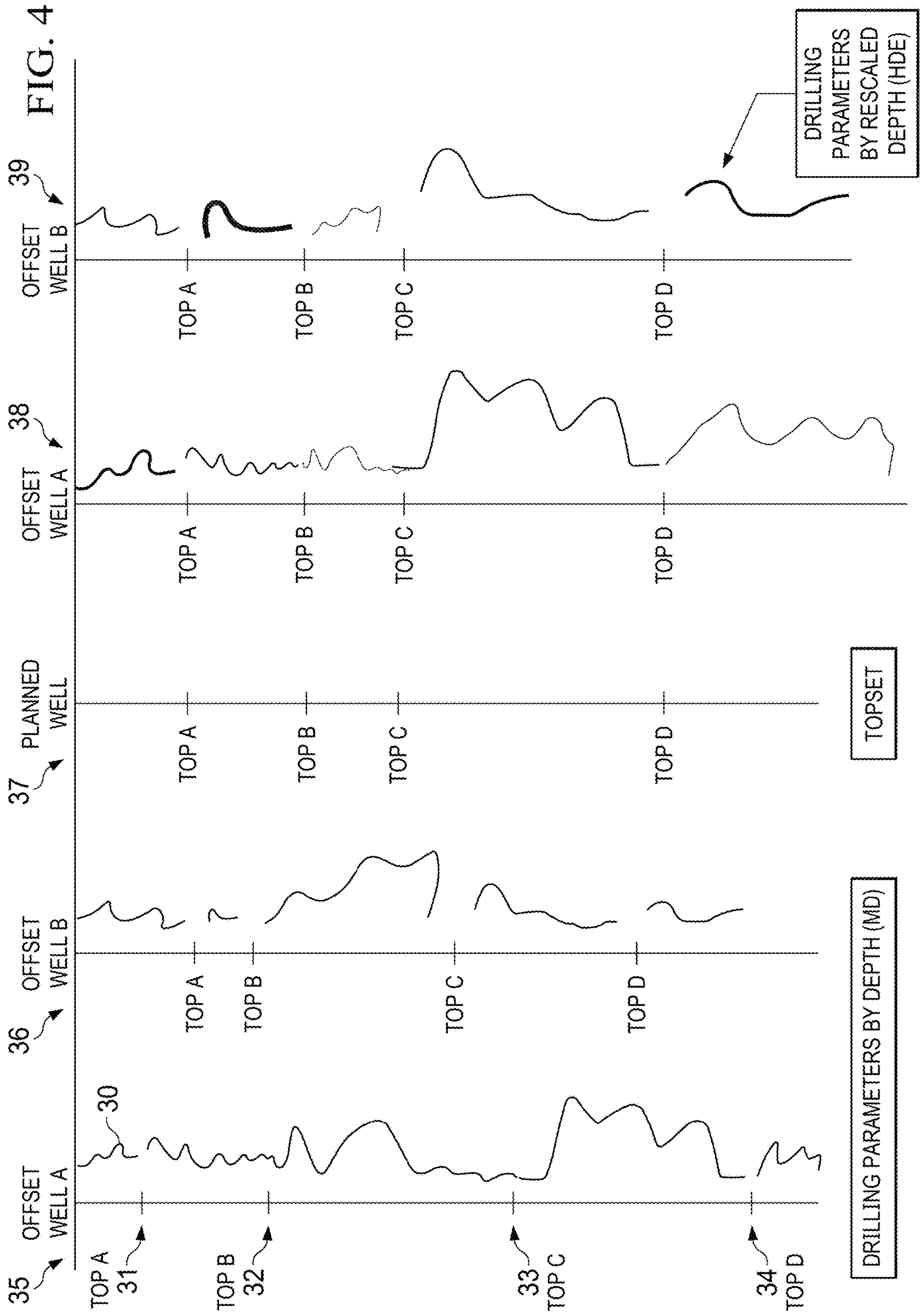
FIG. 4 shows an example embodiment of a rescaled offset well.

The output of the calculation can be represented as a set of offset wells drilling parameters scaled to the planned well trajectory, aligned with the tops at the expected depths as shown in FIG. 4. For example, FIG. 4 shows the drilling parameters by depth 30 with top A 31, top B 32, top C 33, and top D 34 across the offset well A 35, offset well B 36, and the planned well 37. The rescaled offset wells result in a rescaled offset well A 38 and rescaled offset well B 39.

After the scaling process is completed, the equivalent depth index for drilling parameters and the expected Rate of Penetration (ROP) for the planned well becomes available. The resulting drilling roadmap for planned well 40 is generated by comparing the weighted average of the Rate of Penetration (ROP) at each step for every offset well in selection, using the HDE (Hole Depth Equivalent) as the weighting factor.

An example equation for calculating the roadmap ROP is as follows:

$$\text{Roadmap } ROP = [ROP(i) * (HDE(i) - HDE(i-1)) + ROP(i+1) * (HDE(i+1) - HDE(i))]/[(HDE(i) - HDE(i-1)) + (HDE(i+1) - HDE(i))]$$

Optimal ROP to drill in the planned well may be determined, but not limited to, in the following ways. One way is that the maximum averaged ROP across the interval is chosen as the reference for the optimal ROP to drill in the planned well. The estimated optimal ROP is then used to find the corresponding drilling parameters in the offset wells as the respective roadmap for expectations in the planned well.

Another way is to use the subsurface estimation or downhole calculation to optimize the roadmap ROP. An example embodiment would be using Mechanical Specific Energy (MSE). Mechanical Specific Energy (MSE) is the energy required to break a volume of drilled rock and is widely used as a drilling efficiency metric. MSE is divided into two types-Total MSE and Downhole MSE. Total MSE is the total mechanical energy expended in both the drill string and the bit per unit volume of drilled rock, Downhole MSE is the specific energy "at the bit" minus the energy lost in the drill string. MSE may be used in drilling monitoring, optimization and post-analysis workflows.

Mechanical Specific Energy (MSE) is the total amount of the energy that is being put into the drilling string, divided by the amount of rock that is being destroyed The MSE trend gives us an idea of the efficiency, not just the value at a particular point in the drill. Inefficient (non-optimal) drilling ultimately leads to a decrease in ROP. The MSE trend facilitates the selection and determination of the need to change drilling parameters, showing whether the changes were beneficial or not. The MSE trend is used to understand how much the weight on bit (WOB) and rotor speed (RPM) can be increased to be effective. Hence, low drilling efficiency can be used to filter the roadmap ROP and subsequently used as the optimal ROP in the planned well. The same efficiency can then also be used to find the corresponding drilling parameters in the offset wells as the respective roadmap for expectations in the planned well.

Another example embodiment may include Differential Pressure to find the optimal ROP in the planned well. Differential pressure or differential pressure drop is the difference in pressure when idling (the bit is above the bottomhole) and when drilling (the bit is at the bottomhole). It is influenced by mud weight, flow rate, drill bit type, and downhole conditions. This difference when drilling with a downhole motor gives an understanding of the characteristics of the output torque on the bit. When drilling with a downhole motor, the concept of differential pressure is considered more reliable for understanding the "conditional" load on the bit, especially in a slide. This occurs because when sliding the readings of the weight on the hook are not real, since there is a large unloading of the tool on the walls of the well. Differential pressure may be the difference between standpipe pressure when off bottom (not drilling) compared to the same when on bottom (drilling). The differential pressure trend may be used to optimize ROP in the planned well and determine corresponding weight on bit (WOB) and rotation speed (RPM) for that optimal ROP.

An example embodiment may include using a True Vertical Thickness (TVT) scaling of drilling parameters. This approach of drilling optimization is primarily proposed for the horizontal section of the well but not limited to it. The main assumption of consistent drillability along a geological formation is retained here. And as such can be applied to the vertical as well as deviated sections of the wellbore.

In the horizontal part of the well, the resulting Rate of Penetration (ROP) is very much dependent on the position of the wellbore within the formation. In order to address this, the special scaling of the drilling parameters is applied—the drilling parameters of the offset wells are visualized in the True Vertical Thickness (TVT) scale defined by the planned well.

Drilling optimization is not suitable based on MD index comparing drilling parameters from drilled hole sections and/or cased sections between well to well. The general assumption when using the MD index is the drilling Bottom Hole Assembly (BHA) is the main aspect to design and optimized. However, this does not directly take into account drilled lithologies within those sections since the variability of the drilling parameters could be pseudo-indicators for the drilled geology, but could be indicators of the mechanics of the drilling operation, or overall noise in the operations. Relying on MD index therefore does not give the best results when drilling both vertically and horizontally for long distances.

In the horizontal and highly deviated sections of the wellbore, longer intervals of the same geology are drilled along wellbore and drilled lithology thickness usually changes as the geologic beds dip or rise. By considering the TVT of drilled geologic formations, a drilling algorithm can constrain and assign the drilled parameters to right geologic interval which then yields better analysis of the overall drilling and BHA performance.

The TVT scale is a projection of TVD depth onto the same TVD scale. The TVT projection is performed so that the data of a vertical well can be used for the trajectory points. A vertical trajectory passes through geological layers only at a certain place. The data collected from it is tied to the depth of this well. The same layers can have a different formation at a distance from the vertical well. A geologic layer may behave differently at the place where the horizontal well is located than where the vertical one is: somewhere it may have shifted, somewhere it may have bent. To understand which data of a vertical well is applicable to a certain point of a horizontal one, it is necessary to project the points of a horizontal one repeating the behavior of the layers.

Figure 5:
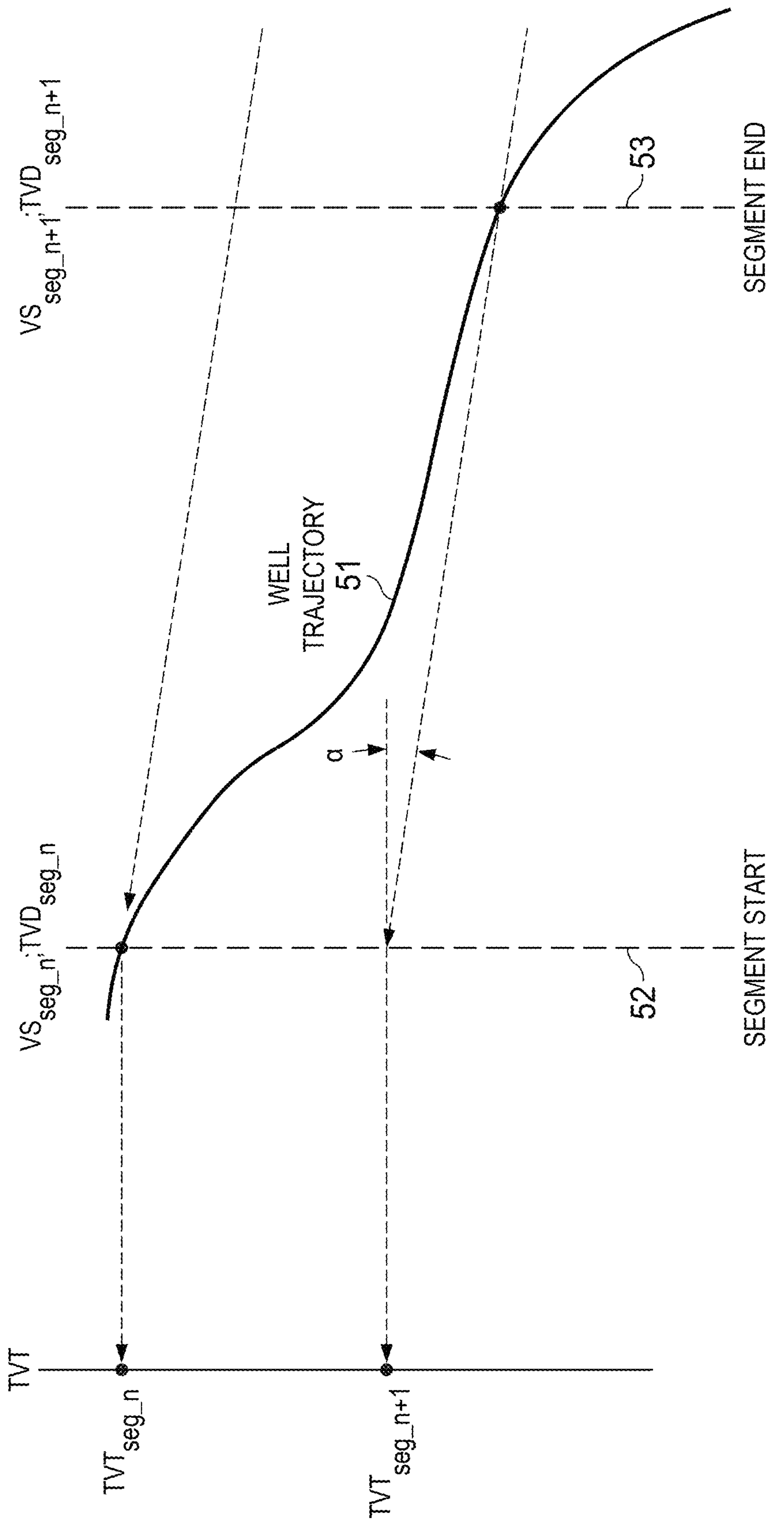
FIG. 5 shows an example embodiment of measured depth to TVT scaling.

This is further depicted in FIG. 5 where the well trajectory 51 passes through a segment start 52 and a segment end 53. It shows in the visualization how the TVT is determined along a trajectory at two different points using the Vertical Section (VS), True Vertical Depth (TVD) and Dip of the formation (α) in which the well trajectory is.

The example equation for calculating the TVT is as follows:

$$TVT(\text{seg\_n}+1) = TVD(n) - [VS(\text{seg\_n}+1) - VS(\text{seg\_n})] * \tan(\alpha)$$

The equation highlighted above, uses the difference in the VS of the well trajectory 51 between the start of the segment 52 and end of the segment 53 with the tangent of the interpreted apparent dip of the formation ($\alpha$) from the end of the segment 53 subtracted from with the actual TVD at start of the segment 52.

This process is repeated for each pair of offset well and active well, resulting in the calculation of TVT scaled curves of drilling parameters. As a result, the drilling parameters for each offset well, originally defined by Measured Depth and True Vertical Depth, now have an equivalent index of True Vertical Thickness corresponding to the position of the planned well.

Figure 6:
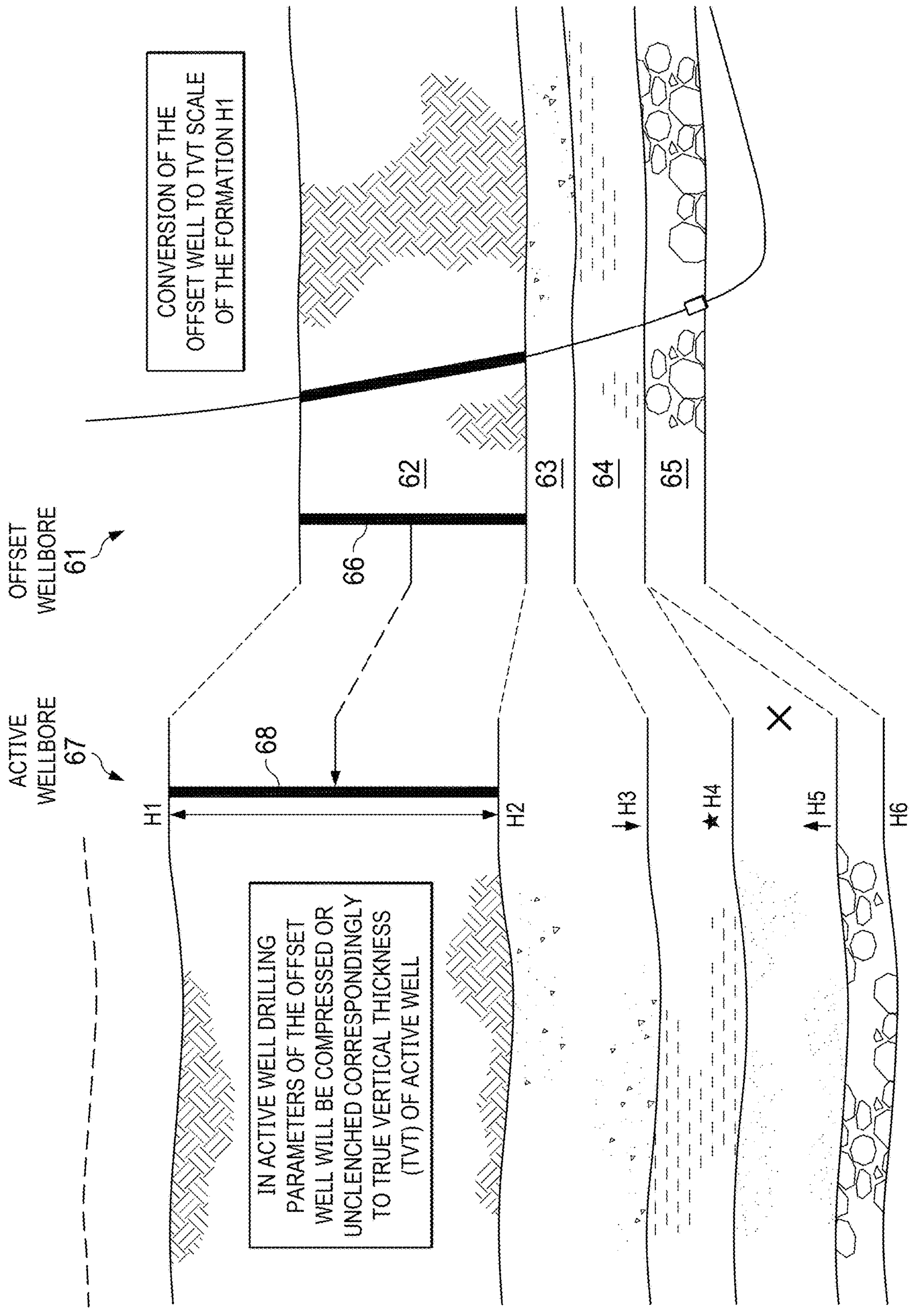
FIG. 6 shows an example embodiment of scaling in a horizontal bed.

Rescaling offsets to active well is done with method similar to HDE, but by taking interpreted formation horizons in TVT index instead of tops in MD index, and TVT depth indexes for offset well data instead of MD. FIG. 6 is a visualization depicting the scaling in a horizontal bed. In the offset wellbore 61 there are several formations 62, 63, 64, and 65. The first formation 62 in offset wellbore 61 has as first TVT scale 66. In the active wellbore 67 the drilling parameters of the first formation 62 in the offset wellbore 61 are compressed or unclenched correspondingly to true vertical thickness of the first formation 68 in the active well 67. This process is done for all the formations (62, 63, 64, and 65) to develop true vertical thicknesses within the active well 67.

Here is how the HDE is defined:

For offset TVT=0,planned HDE=0.

For each subsequent sample (i+1), HDE (i+1) is calculated as follows:

$$HDE(i+1) = HDE(i) + (TVT(i+1) - TVT(i)) * \big[(\text{Lower Top} - \text{Upper Top})\ \text{of the planned well}/(\text{Lower Top} - \text{Upper Top})\big]\ \text{of the offset well}\big]\ \text{for every geological formation.}$$

Figure 7A:
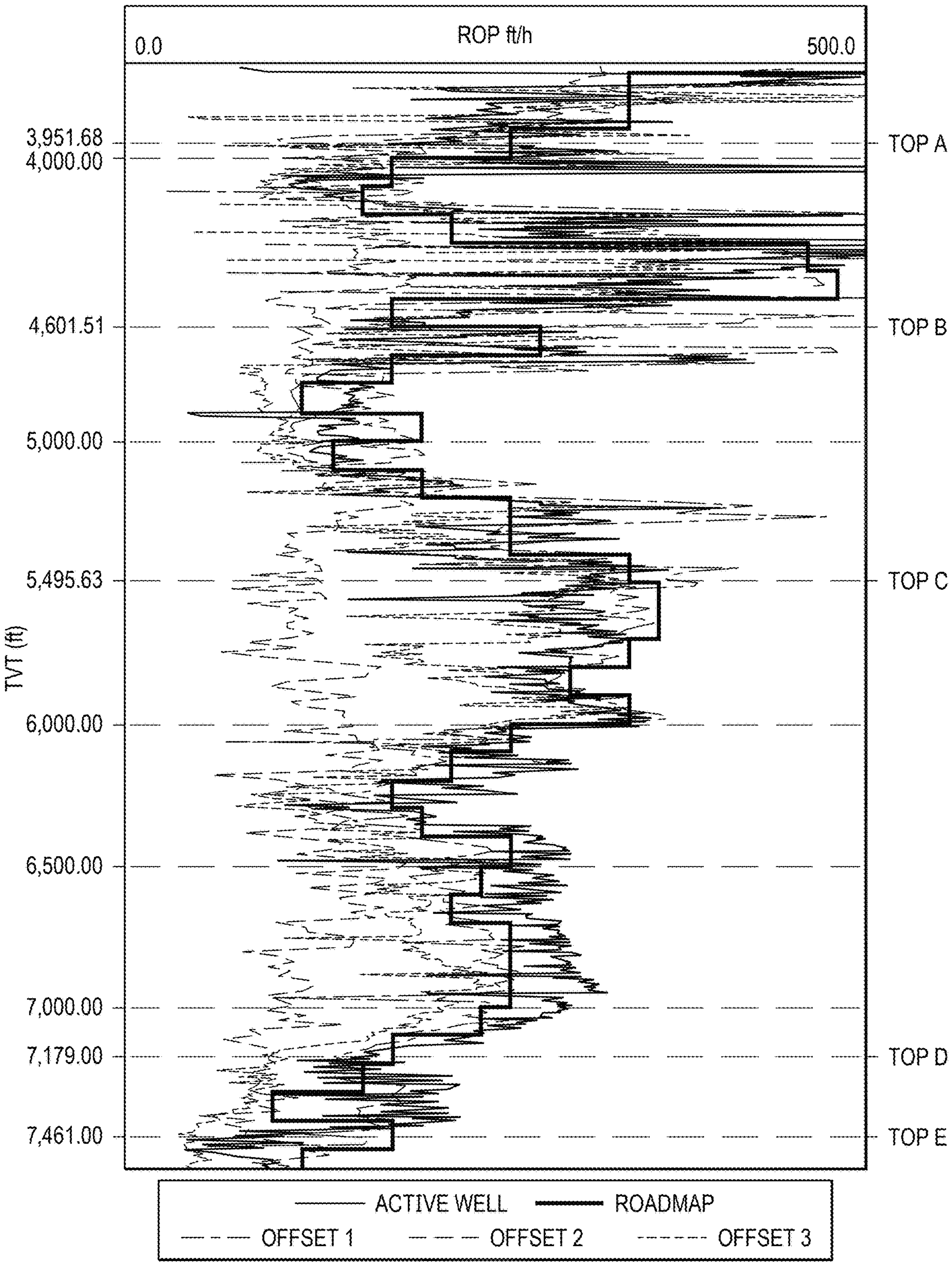
FIG. 7*a*-7*c* shows an example embodiment of the rescaled drilling parameters with a roadmap for an active well.
Figure 7B:
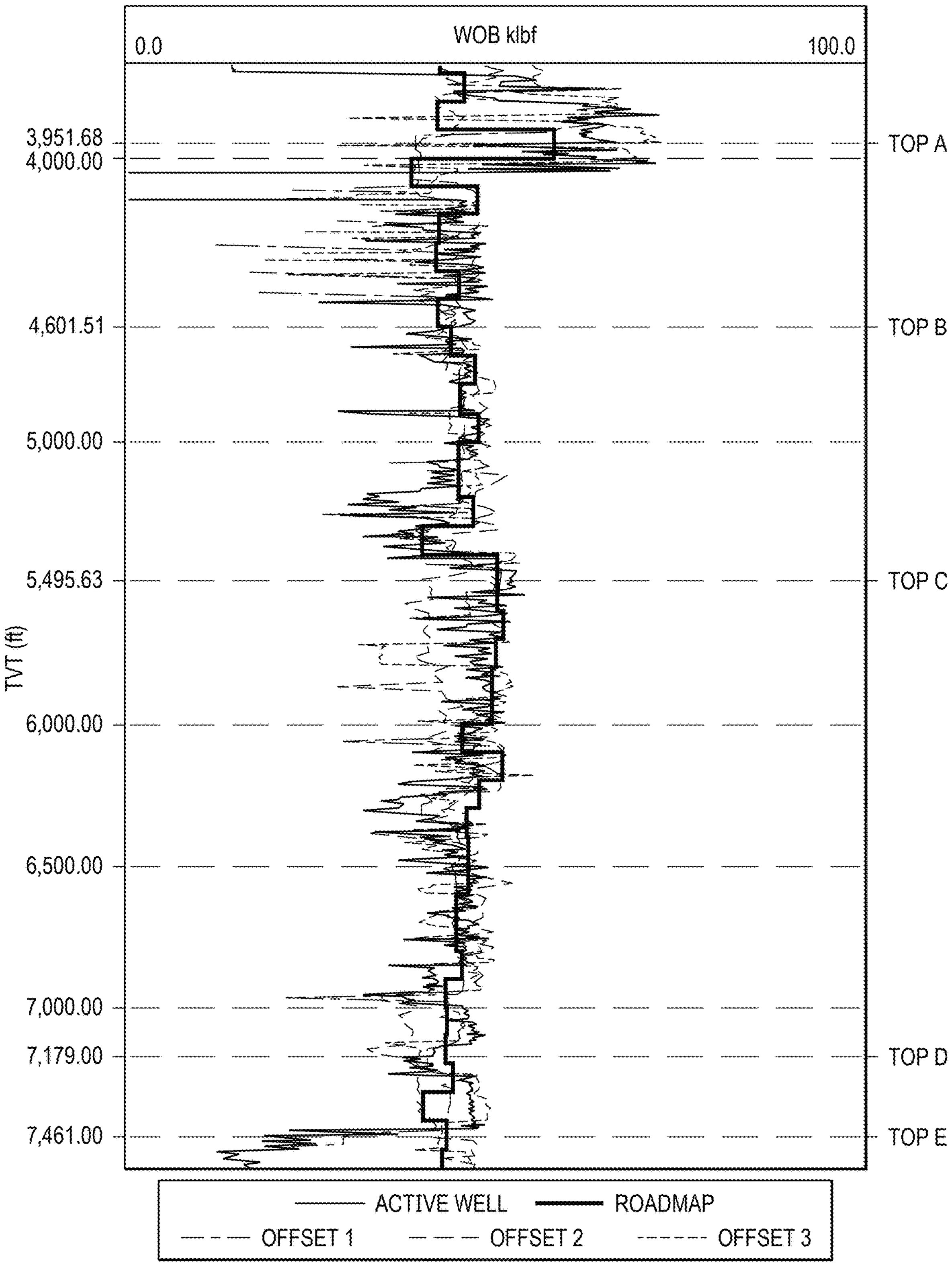
Figure 7C:
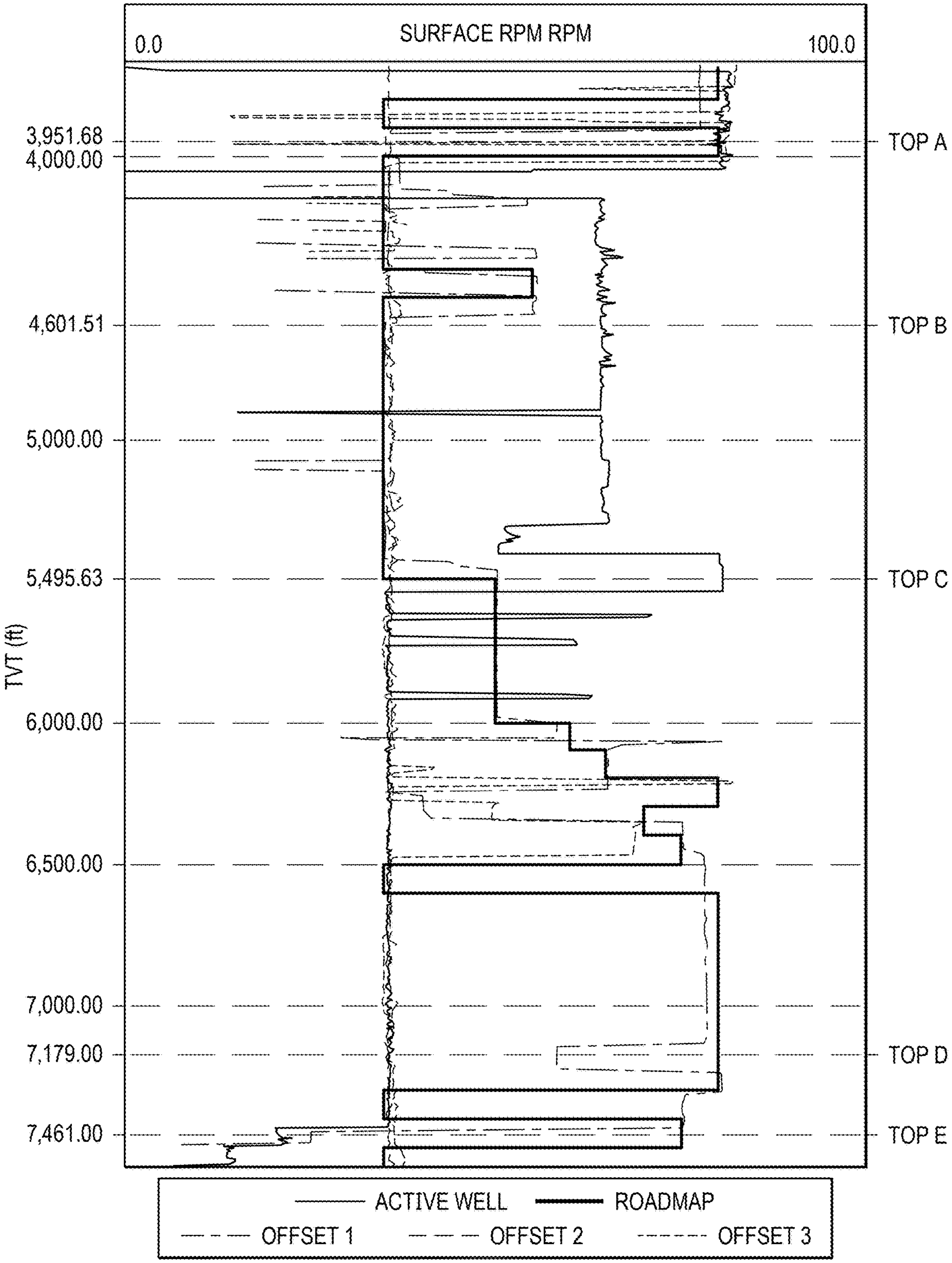

Optimal ROP is to be determined as described previously in this disclosure. In addition, the system may monitor real-time drilling data from downhole sensors and dynamically adjust the rescaled drilling parameters in response to changes in formation dip and inclination to optimize the rate of penetration. FIGS. 7*a*, 7*b* and 7*e* is an example embodiment of what a TVT-based rescaling of the drilling parameters, for respective geologic tops A to E in offset and active wellbores, may look like but not limited to it. For example, in addition to the above the scaled offset data to the planned well may also be presented statistically, using applied mathematical workflows, with a generated heatmap for the planned well. FIG. 7*a*-7*c* show how offset wells 1, 2, and 3 can be used to create a roadmap that is used to guide the active well as described herein.

The disclosed method for optimizing wellbore models can be applied across a wide range of geological formations and operational settings. For example, in deepwater drilling, where formation pressures and temperatures are high, the method's ability to rescale drilling parameters based on the true vertical thickness (TVT) provides critical insights into how the formations behave at different depths. In unconventional formations, such as shale plays, the method enables accurate scaling of drilling parameters in lateral wells, leading to more efficient penetration rates and enhanced production performance. A deepwater offshore well using rescaled drilling parameters based on geological tops and horizons, could result in a 15% improvement in rate of penetration (ROP) while maintaining wellbore stability.

The methodology described herein is not limited to the specific parameters outlined but can be modified to suit various well profiles and geological conditions. For instance, while the predetermined inclination threshold is set at 85 degrees, the system could be adapted to function with a dynamic inclination threshold, allowing for increased flexibility in deviated and highly complex wells. Furthermore, the method could integrate with other optimization technologies, such as managed pressure drilling (MPD) systems, where real-time pressure adjustments are crucial to maintaining wellbore integrity in high-pressure, high-temperature (HPHT) formations. Such variations in application extend the scope and usefulness of the disclosed embodiments across diverse well types and operational strategies.

One example embodiment could incorporate artificial intelligence (AI) and machine learning (ML) systems that use real-time drilling data to optimize the scaling of drilling parameters. As data is continuously fed from the wellsite, AI algorithms could dynamically adjust the roadmap for drilling, making real-time predictions about the optimal ROP and drilling parameters based on historical and real-time data inputs. These AI-driven insights could enable predictive adjustments in weight on bit (WOB), RPM, and mud flow rates, further enhancing operational efficiency and reducing downtime caused by suboptimal drilling practices. By integrating AI/ML systems, the method would facilitate more precise drilling, especially in unpredictable formations.

An additional benefit of the disclosed method is its potential to improve safety and reduce environmental impact. By optimizing the rate of penetration and reducing drilling time, this method can decrease the overall footprint of drilling operations. Shorter drilling durations translate to less time spent on location, reducing the risk of equipment failure and blowouts, while also lowering fuel consumption and emissions from drilling rigs. The method's real-time adaptability ensures that parameters can be adjusted to avoid hazardous conditions such as wellbore instability, leading to safer drilling operations and reduced risk to personnel and the environment.

In an expanded embodiment, the method could include the integration of third-party geological modeling software. The TVT scaling methodology could be utilized as a plug-in or module within these systems, allowing operators to import offset well data directly into their geological models for more precise planning. Additionally, real-time data from sensors located along the drill string could be fed into the system, providing continuous feedback and allowing for on-the-fly adjustments to the drilling parameters. This would enable the creation of a fully automated drilling optimization system that adjusts in real time to changing formation characteristics, ensuring optimal ROP throughout the drilling process.

Although the terms described in the example embodiments are set forth in detail, it should be understood that this is by illustration only and that the example embodiments are not necessarily limited thereto. For example, terms such as upper and lower or top and bottom can be substituted with uphole and downhole, respectfully. Top and bottom could be left and right, respectively. Uphole and downhole could be shown in figures as left and right, respectively, or top and bottom, respectively. Generally downhole tools initially enter the borehole in a vertical orientation, but since some boreholes end up horizontal, the orientation of the tool may change. In that case downhole, lower, or bottom is generally a component in the tool string that enters the borehole before a component referred to as uphole, upper, or top, relatively speaking. Terms like wellbore, borehole, well, bore, oil well, and other alternatives may be used synonymously. Terms like tool string, tool, drill string, string, or downhole tools, and other alternatives may be used synonymously. The alternative embodiments and operating techniques will become apparent to those of ordinary skill in the art in view of the present disclosure. Accordingly, modifications of the example embodiments are contemplated which may be made without departing from the spirit of the claims.

What is claimed is:

1. A method for optimizing a wellbore model, comprising:

planning a wellbore model prior to drilling operations, further comprising:

measuring a plurality of geological top sets and formation horizons from at least one offset well, wherein the plurality of geological topsets and formation horizons are associated with a plurality of geological formations, wherein the plurality of geological formations each have an associated formation thickness based on the geological topsets and formation horizons, and wherein the geological formations correspond to a plurality of drilling parameters corresponding to a measured depth, including weight on bit (WOB), rotary speed (RPM), mud flow rate, and differential pressure, by measured depth;

combining the measured plurality of geological top sets and formation horizons to generate a planned well trajectory;

determining the inclination of the planned well trajectory;

identifying whether the inclination is above or below a predetermined threshold;

scaling the measured depth of the drilling parameters using a Hole Depth Equivalent (HDE) scaling algorithm if the inclination is less than the predetermined threshold, wherein the HDE scaling algorithm adjusts measured depth data proportionally to formation thickness based on geological formation tops identified in the at least one offset well and the planned well trajectory;

scaling the drilling parameters to a true vertical thickness (TVT) if the inclination exceeds the predetermined threshold, wherein the TVT scaling applies a formation dip angle correction algorithm;

executing the drilling operation, further comprising:

drilling according to the scaled drilling parameters generated from the planned well trajectory;

receiving real-time drilling data from downhole sensors disposed along a drill string;

dynamically rescaling the drilling parameters in real-time in response to changes in formation dip and inclination by comparing real-time data against the planned well trajectory, wherein the dynamically rescaling of the scaled drilling parameters comprises dynamically adjusting the scaled drilling parameters using the HDE scaling algorithm if the inclination is less than the predetermined threshold or adjusting the scaling of the drilling parameters to the true vertical thickness if the inclination exceeds the predetermined threshold; and controlling a bottom-hole assembly (BHA) in real-time adjusting the weight on bit (WOB), rotary speed, mud flow rate, and differential pressure to match the dynamically rescaled drilling parameters.

2. The method of claim 1, wherein the at least one offset well is a plurality of offset wells.

3. The method of claim 1, wherein each geological topset and formation horizon denotes a change in formation.

4. The method of claim 1, wherein calculating the true vertical thickness of the drilling parameters in at least one desired geological formation of the plurality of geological formations includes compressing or unclenching the vertical thickness of the at least one desired geological formation to scale the drilling parameters to the true vertical thickness of the at least one desired geologic formation in the planned well.

5. The method of claim 1, wherein the predetermined threshold is an inclination between 80 and 85 degrees.

6. The method of claim 1, wherein the scaling the drilling parameters to their true vertical thickness includes calculating the true vertical thickness index of a plurality of desired geological formations to generate a statistical analysis of the scaled drilling parameters and rate of penetration and to further generate a heatmap for the planned well.

7. The method of claim 1, further comprising planning a drilling program, wherein the drilling program includes the planned well trajectory.

8. The method of claim 7, further comprising adjusting the drilling program during real-time drilling.

9. A method for optimizing a wellbore model, comprising:

planning a wellbore model prior to drilling operations, further comprising:

measuring a plurality of geological topsets and formation horizons from at least one offset well that are associated with a plurality of geological formations, wherein the plurality of geological formations each have an associated formation thickness based on the geological topsets and formation horizons, and wherein the geological formations correspond to a plurality of drilling parameters corresponding to a measured depth, including weight on bit (WOB), rotary speed (RPM), mud flow rate, and differential pressure, by measured depth;

combining the measured plurality of geological topsets and formation horizons to generate a planned well trajectory;

determining the inclination of the planned well trajectory, wherein a predetermined inclination threshold is between 80 and 85 degrees;

scaling the measured depth of the drilling parameters using a Hole Depth Equivalent (HDE) method if the inclination is less than the predetermined inclination threshold, wherein the rescaling proportionally adjusts the drilling parameters based on the associated formation thicknesses;

scaling the drilling parameters to their true vertical thickness (TVT) if the inclination exceeds the predetermined inclination threshold, wherein TVT scaling compresses or expands the drilling parameters based on the true vertical thickness of the geological formation encountered in the planned well;

executing the drilling operation, further comprising:

drilling according to the scaled drilling parameters generated from the planned well trajectory;

monitoring real-time drilling data from downhole sensors and dynamically adjusting the scaled drilling parameters in response to changes in formation dip and inclination;

comparing real-time data against the planned well trajectory to optimize the rate of penetration (ROP), wherein dynamically adjusting the scaled drilling parameters comprises dynamically adjusting the scaled drilling parameters using the HDE method if the inclination is less than the predetermined inclination threshold or adjusting the scaling of the drilling parameters to their true vertical thickness if the inclination exceeds the predetermined inclination threshold; and controlling a bottom-hole assembly in real-time using the dynamically adjusted scaled drilling parameters and adjusting the drilling operations based on real-time sensor data from downhole sensors to match the measured drilling parameters with the dynamically adjusted drilling parameters.

10. The method of claim 9, wherein the at least one offset well is a plurality of offset wells, and the drilling parameters of each offset well are scaled using the hole depth equivalent (HDE) method for vertical or deviated well sections, and a true vertical thickness (TVT) method for horizontal well sections.

11. The method of claim 9, further comprising generating a roadmap for the planned well based on the scaled drilling parameters from the plurality of offset wells and calculating the optimal rate of penetration (ROP).

12. The method of claim 9, further comprising monitoring the real-time drilling data from the planned well during drilling operations and adjusting the drilling parameters based on the monitored real-time data using the rescaled and true vertical thickness-scaled parameters from the offset wells.

13. The method of claim 12, wherein the real-time drilling data is transmitted via a Wellsite Information Transfer Standard Markup Language (WITSML) interface for analysis by third-party software systems.

14. The method of claim 12, further comprising using Mechanical Specific Energy (MSE) analysis to optimize a roadmap by identifying drilling inefficiencies and adjusting the weight on bit (WOB) and the rotary speed (RPM) to enhance drilling performance.

15. The method of claim 9, further comprising performing statistical analysis of the dynamically rescaled drilling parameters to identify optimal drilling performance across the geological formations and generating a heatmap of expected drilling efficiency for the planned well.

16. The method of claim 9, wherein the scaling of the drilling parameters is based on the geological formation characteristics, including formation dips, thicknesses, and horizons, and the parameters are adjusted for different geological conditions within the well trajectory.

17. The method of claim 9, further comprising integrating third-party geological modeling software to correlate the offset well data with the geological topsets and horizons, and rescaling the data using the true vertical thickness index for the planned well trajectory.

* * * * *